(12) United States Patent
Lin

(10) Patent No.: US 12,300,350 B2
(45) Date of Patent: May 13, 2025

(54) RECEIVING CIRCUIT AND MEMORY

(71) Applicant: CHANGXIN MEMORY TECHNOLOGIES, INC., Hefei (CN)

(72) Inventor: Feng Lin, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 152 days.

(21) Appl. No.: 18/150,921

(22) Filed: Jan. 6, 2023

(65) Prior Publication Data
US 2023/0395106 A1 Dec. 7, 2023

Related U.S. Application Data

(63) Continuation of application No. PCT/CN2022/111185, filed on Aug. 9, 2022.

(30) Foreign Application Priority Data

Jun. 1, 2022 (CN) .......................... 202210623097.6

(51) Int. Cl.
G11C 16/04 (2006.01)
G11C 7/10 (2006.01)
G11C 7/14 (2006.01)

(52) U.S. Cl.
CPC ............ *G11C 7/1084* (2013.01); *G11C 7/109* (2013.01); *G11C 7/14* (2013.01)

(58) Field of Classification Search
CPC .......... G11C 7/1084; G11C 7/109; G11C 7/14
See application file for complete search history.

(56) References Cited

U.S. PATENT DOCUMENTS

| 6,504,404 B2 * | 1/2003 | Uchiki | ................ | H03F 3/45708 327/563 |
| 6,784,718 B2 * | 8/2004 | Okamoto | ................ | G11C 7/22 327/333 |

(Continued)

FOREIGN PATENT DOCUMENTS

| CN | 107534440 A | 1/2018 |
| CN | 107785046 A | 3/2018 |

(Continued)

OTHER PUBLICATIONS

International Search Report cited in PCT/CN2022/111185 mailed Nov. 28, 2022, 8 pages.
Japanese Patent Office, Office Action Issued in Application No. 2023-528417, Aug. 6, 2024, 11 pages.
Korean Intellectual Property Office, Office Action Issued in Application No. 10-2023-7013120, Dec. 11, 2024, 12 pages.

(Continued)

*Primary Examiner* — Pho M Luu
(74) *Attorney, Agent, or Firm* — Kilpatrick Townsend & Stockton LLP

(57) ABSTRACT

A receiving circuit includes: an input buffer configured to receive a first input signal and a second input signal, compare the first input signal with the second input signal, and output a first output signal and a second output signal, where the first input signal and the second input signal are respectively a first signal and a second signal in a differential mode, the first input signal is one of the first signal and the second signal in a single-ended mode, the second input signal is a reference voltage signal, and the first signal and the second signal are complementary; and a conversion module configured to receive the first output signal and the second output signal and amplify a voltage difference between the first output signal and the second output signal.

17 Claims, 6 Drawing Sheets

(56) References Cited

U.S. PATENT DOCUMENTS

| | | | |
|---|---|---|---|
| 7,098,699 B2* | 8/2006 | Tamura | G11C 7/1069 |
| | | | 327/108 |
| 8,891,329 B2* | 11/2014 | Yang | H03K 19/00384 |
| | | | 365/189.05 |
| 9,444,461 B1 | 9/2016 | Milijevic et al. | |
| 10,319,430 B2 | 6/2019 | Itoh | |
| 10,714,156 B2 | 7/2020 | Mohr et al. | |
| 10,819,296 B2 | 10/2020 | Maccarrone et al. | |
| 2005/0041451 A1 | 2/2005 | Seo et al. | |
| 2011/0031999 A1 | 2/2011 | Beat | |
| 2011/0075740 A1 | 3/2011 | Ferraiolo et al. | |
| 2012/0299653 A1 | 11/2012 | Scott et al. | |
| 2019/0356289 A1 | 11/2019 | Cho et al. | |
| 2021/0143807 A1 | 5/2021 | Kim et al. | |

FOREIGN PATENT DOCUMENTS

| | | |
|---|---|---|
| CN | 110880339 A | 3/2020 |
| CN | 111724833 A | 9/2020 |
| JP | 2006030949 A | 2/2006 |
| JP | 2012044256 A | 3/2012 |
| JP | 2013058045 A | 3/2013 |
| KR | 20150064404 A | 6/2015 |

OTHER PUBLICATIONS

Shuai Yuan et al., "A 10-Gb/s Simplified Transceiver with a Quarter-Rate 4-Tap Decision Feedback Equalizer in 0.18-.m CMOS Technolog", 2013 IEEE 10th International Conference on ASIC.

* cited by examiner

RECEIVING CIRCUIT AND MEMORY

CROSS-REFERENCE TO RELATED APPLICATIONS

This is a continuation of International Application No. PCT/CN2022/111185, filed on Aug. 9, 2022, which claims the priority to Chinese Patent Application No. 202210623097.6, titled "RECEIVING CIRCUIT AND MEMORY" and filed on Jun. 1, 2022. The entire contents of International Application No. PCT/CN2022/111185 and Chinese Patent Application No. 202210623097.6 are incorporated herein by reference.

TECHNICAL FIELD

The present disclosure relates to, but is not limited to, a receiving circuit and a memory.

BACKGROUND

As a semiconductor memory device commonly used in a computer, a dynamic random access memory (DRAM) includes many repeated memory cells. Each memory cell usually includes a capacitor and a transistor. The transistor is provided with a gate connected to a word line, a drain connected to a bit line, and a source connected to the capacitor. A voltage signal on the word line can be configured to control on or off of the transistor, and then data information stored in the capacitor is read through the bit line, or the data information is written into the capacitor through the bit line for storage.

The DRAM may include a double data rate (DDR) DRAM, a graphics double data rate (GDDR) DRAM, and a low power double data rate (LPDDR) DRAM. As the DRAM is applied to more and more fields, for example, the DRAM is increasingly used in the mobile field, users have increasingly higher requirements on the power consumption of the DRAM.

SUMMARY

An overview of the subject matter described in detail in the present disclosure is provided below, which is not intended to limit the protection scope of the claims.

The present disclosure provides a receiving circuit and a memory.

A first aspect of the present disclosure provides a receiving circuit, including: an input buffer, configured to receive a first input signal and a second input signal, compare the first input signal with the second input signal, and output a first output signal and a second output signal, where in a differential mode, the first input signal and the second input signal are respectively a first signal and a second signal, and in a single-ended mode, the first input signal is one of the first signal and the second signal, the second input signal is a reference voltage signal, and the first signal and the second signal are complementary; and a conversion module, configured to receive the first output signal and the second output signal and amplify a voltage difference between the first output signal and the second output signal to output a first internal signal and a second internal signal.

A second aspect of the present disclosure provides a memory, including the receiving circuit as described in the first aspect.

Other aspects of the present disclosure are understandable upon reading and understanding of the accompanying drawings and detailed description.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals are used to represent similar elements. The accompanying drawings in the following description are some rather than all of the embodiments of the present disclosure. Those skilled in the art may obtain other accompanying drawings based on these accompanying drawings without creative efforts.

DETAILED DESCRIPTION

The technical solutions in the embodiments of the present disclosure are described below clearly and completely with reference to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

After analysis, it is found that the receiving circuit is operated in the differential mode or the single-ended mode according to actual requirements. However, the receiving circuit creates separate clock paths for the differential mode and the single-ended mode. That is, a clock signal received by the receiving circuit in the differential mode and a clock signal received by the receiving circuit in the single-ended mode use different clock paths.

Figure 2:
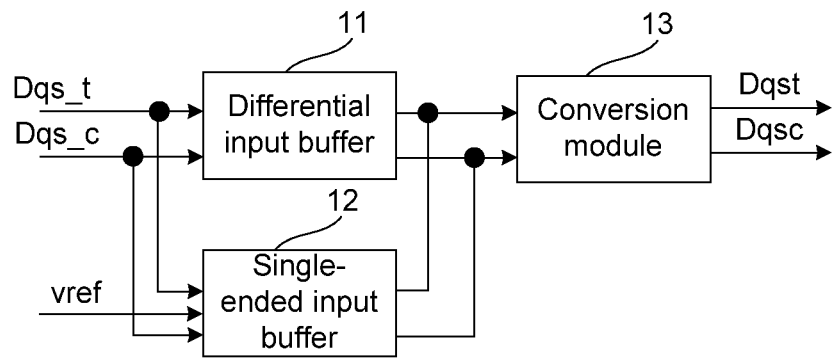
FIG. 2 is a functional block diagram of a receiving circuit.

Referring to FIG. 2, FIG. 2 is a functional block diagram of a receiving circuit. The receiving circuit includes: two input buffers, namely a differential input buffer 11 and a single-ended input buffer 12; and a conversion module 13. When the receiving circuit is operated in the differential mode, the differential input buffer 11 is in an operating state, and at this time, the single-ended input buffer 12 is in a non-operating state. The differential input buffer 11 receives a first input signal Dqs_t and a second input signal Dqs_c through a first clock path and outputs same to the conversion module 13, and the conversion module 13 outputs a first internal signal Dqs_t and a second internal signal Dqs_c. When the receiving circuit is operated in the single-ended mode, the single-ended input buffer 12 is in the operating state, and at this time, the differential input buffer 11 is in the non-operating state. The single-ended input buffer 12 receives one of the first input signal Dqs_t and the second input signal Dqs_c through a second clock path, receives a reference voltage signal vref, and outputs same to the conversion module 13, and the conversion module 13 outputs the first internal signal Dqst and the second internal signal Dqsc.

In view of the above, the differential input buffer 11 adopts the first clock path when receiving the first input signal Dqs_t and the second input signal Dqs_c, the single-ended input buffer 12 adopts the second clock path when receiving one of the first input signal Dqs_t and the second input signal Dqs_c, and the first clock path is different from the second clock path. In this way, when the receiving circuit is switched between the differential mode and the single-ended mode, there is an interference between the first clock path and the second clock path, such that the first input signal Dqs_t and/or the second input signal Dqs_c received by the input buffer generate glitches, thereby reducing the accuracy of the first internal signal Dqst and the second internal signal Dqsc outputted by the conversion module 13. In addition, two input buffers are designed in the receiving circuit, which is not beneficial to simplify the layout of the receiving circuit, increases the complexity of the receiving circuit, and is not beneficial to save the overall power consumption of the receiving circuit.

The embodiments of the present disclosure provide a receiving circuit and a memory. In the receiving circuit, the input buffer may be operated in the differential mode through the first signal and the second signal, and may also be operated in the single-ended mode through the reference voltage signal and one of the first signal and the second signal. That is, the same input buffer may be operated in the differential mode, and may also be operated in the single-ended mode, thereby facilitating reducing the complexity of the receiving circuit, and reducing the layout area of the receiving circuit. In addition, in the single-ended mode, the input buffer only receives one of the first signal and the second signal, and the additionally received signal is the reference voltage signal, which may reduce the operating current in the receiving circuit, thereby facilitating reducing the power consumption of the receiving circuit.

Figure 7:
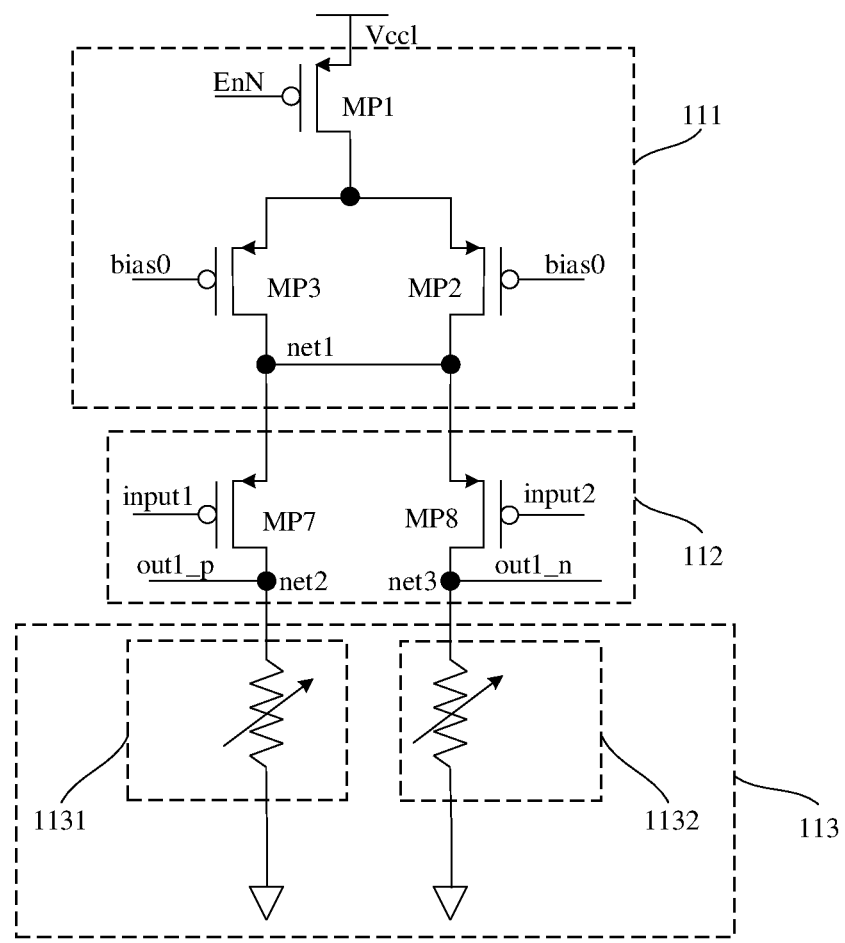
FIG. 7 and FIG. 8 are schematic diagrams of two circuit structures of an input buffer in a receiving circuit according to one embodiment of the present disclosure.
Figure 8:
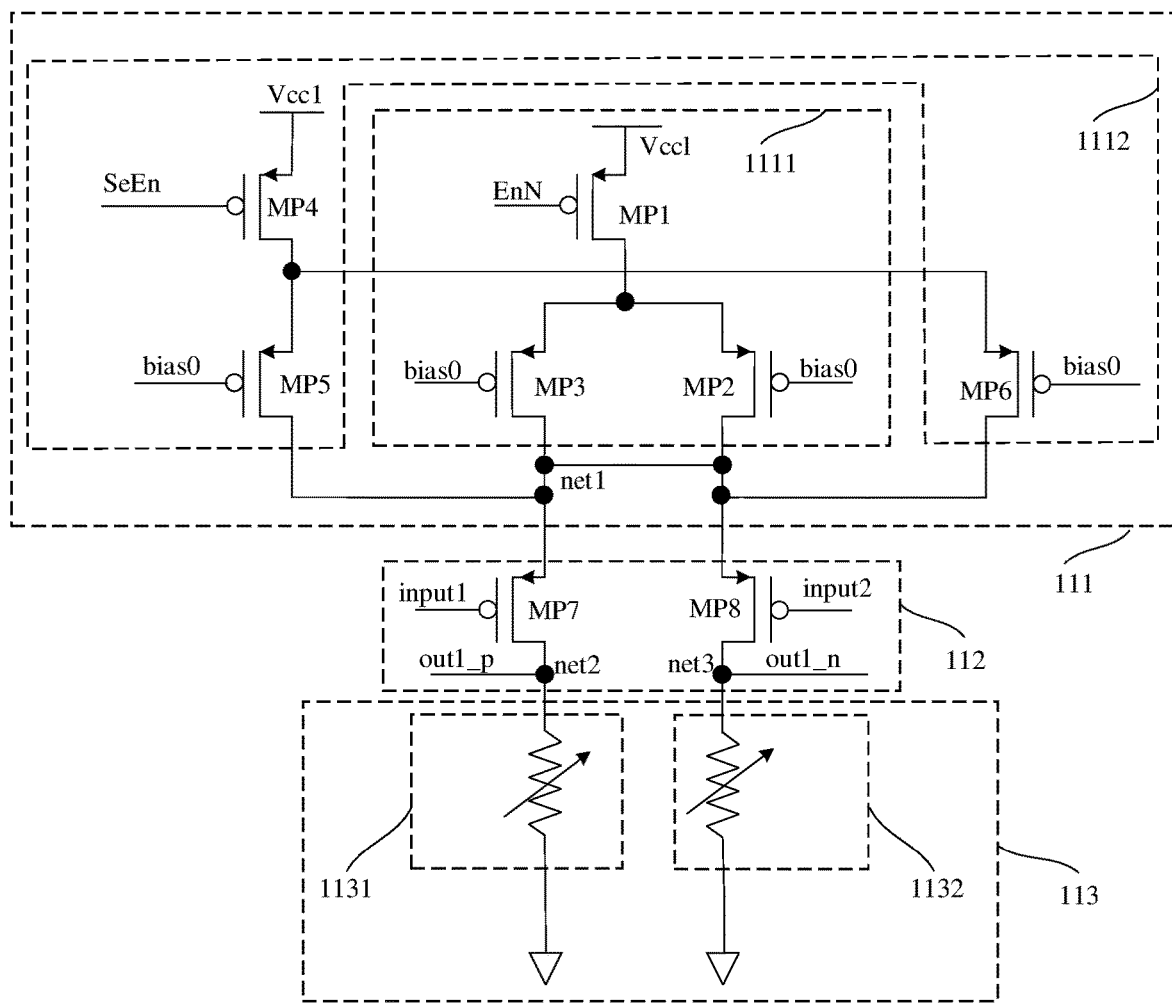
Figure 9:
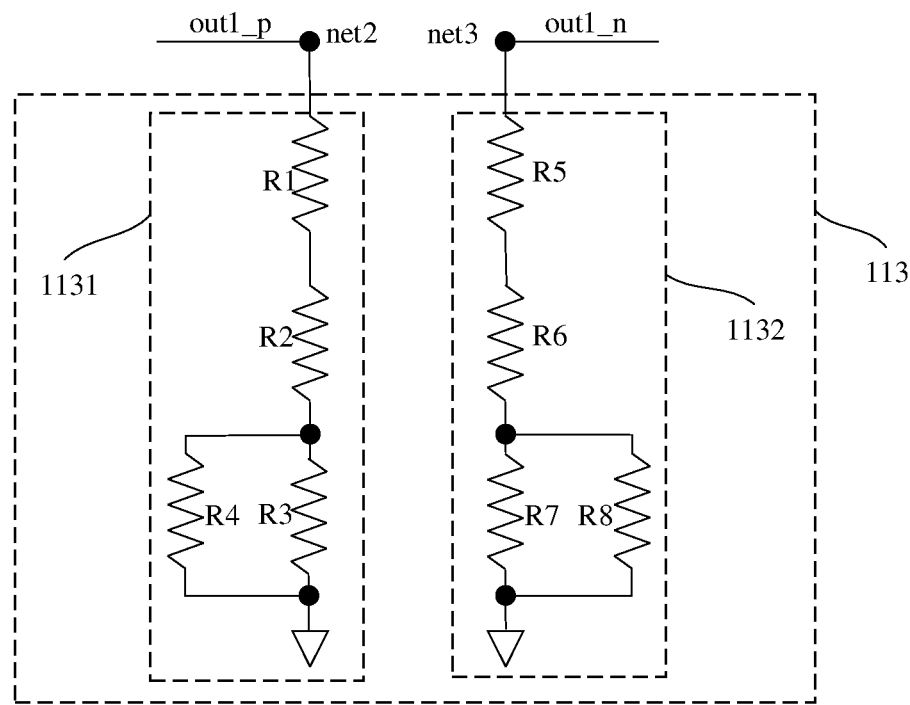
FIG. 9 to FIG. 11 are schematic diagrams of three circuit structures of a load module in a receiving circuit according to one embodiment of the present disclosure.
Figure 10:
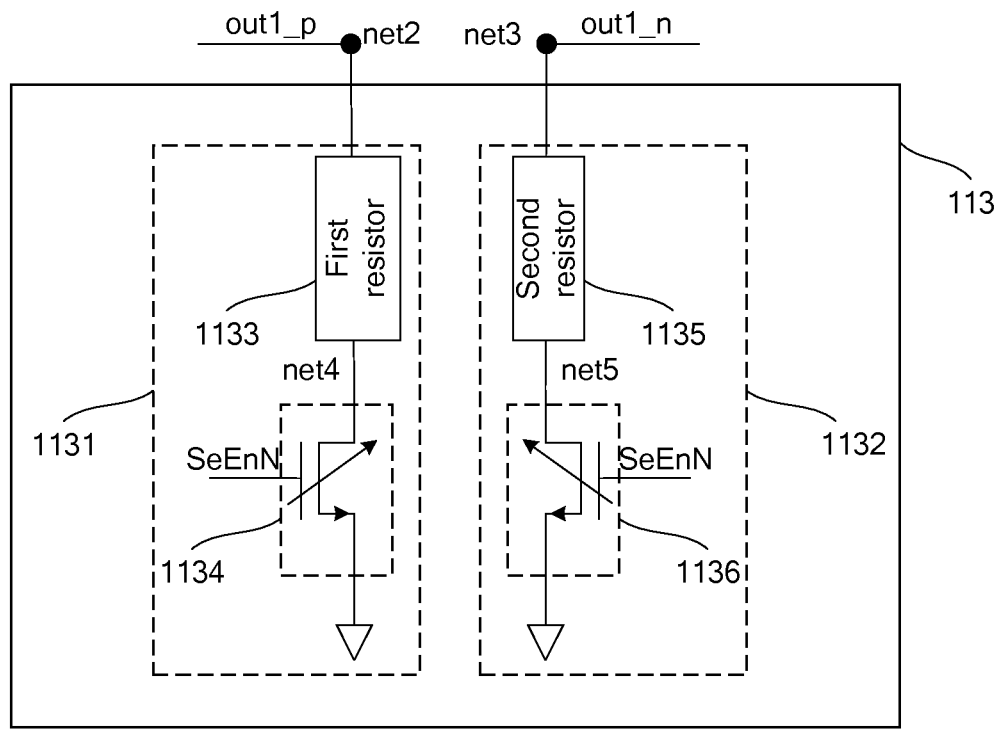
Figure 11:
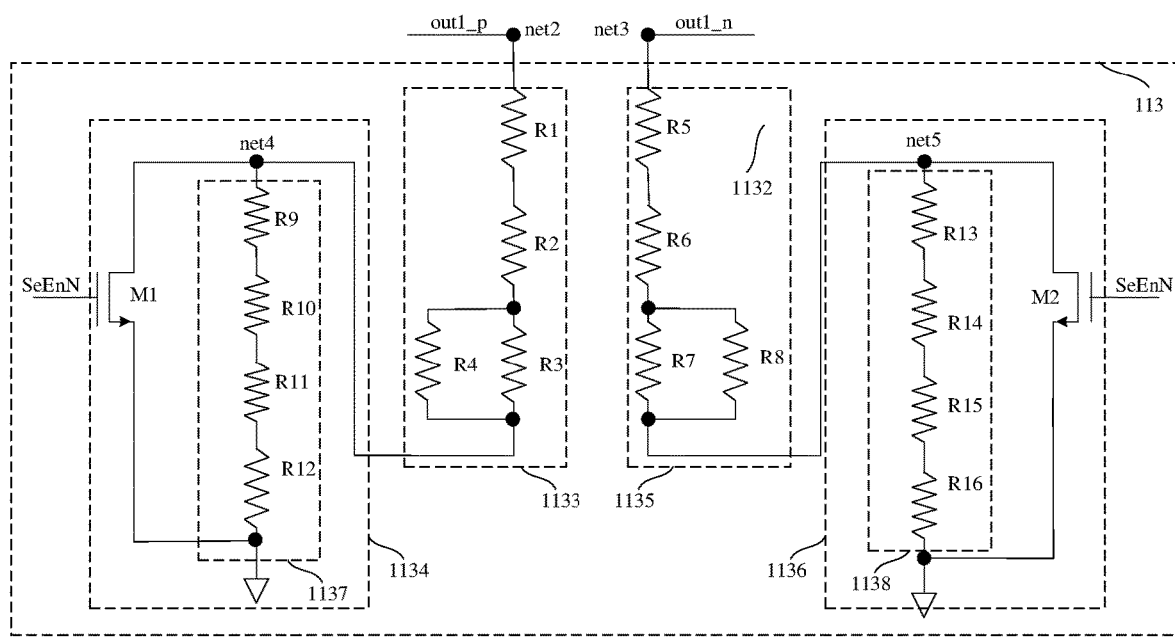

One embodiment of the present disclosure provides a receiving circuit. The receiving circuit provided by one embodiment of the present disclosure is described in detail below with reference to the accompanying drawings. FIG. 1 and FIG. 3 to FIG. 6 are five functional block diagrams of a receiving circuit according to one embodiment of the present disclosure; FIG. 7 and FIG. 8 are schematic diagrams of two circuit structures of an input buffer in a receiving circuit according to one embodiment of the present disclosure; and FIG. 9 to FIG. 11 are schematic diagrams of three circuit structures of a load module in a receiving circuit according to one embodiment of the present disclosure.

Figure 1:
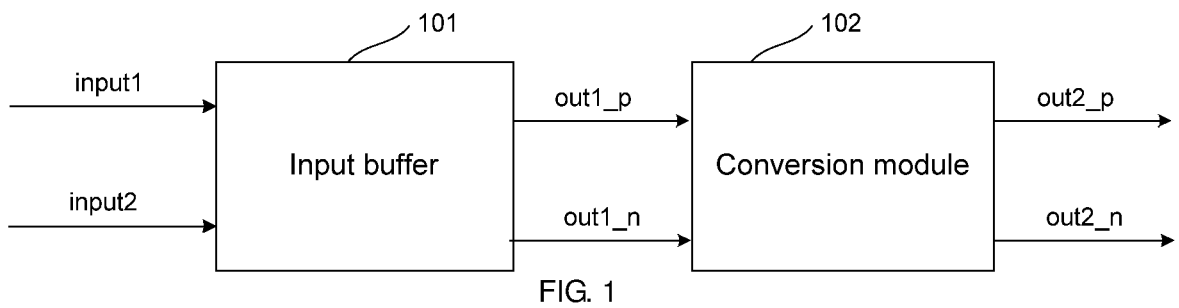
FIG. 1 is a functional block diagram of a receiving circuit according to one embodiment of the present disclosure.
Figure 3:
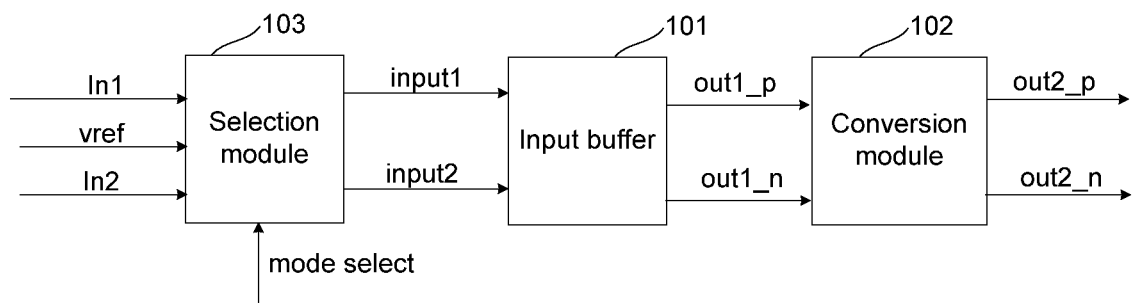
FIG. 3 to FIG. 6 are another four functional block diagrams of a receiving circuit according to one embodiment of the present disclosure.

Referring to FIG. 1 and FIG. 3, the receiving circuit includes: an input buffer 101 configured to receive a first input signal input1 and a second input signal input2, compare the first input signal input1 with the second input signal input2, and output a first output signal out1_p and a second output signal out1_n, where in a differential mode, the first input signal input1 and the second input signal input2 are respectively a first signal In1 and a second signal In2, and in a single-ended mode, the first input signal input1 is one of the first signal In1 and the second signal In2, the second input signal input2 is a reference voltage signal vref, and the first signal In1 and the second signal In2 are complementary; and a conversion module 102 configured to receive the first output signal out1_p and the second output signal out1_n and amplify a voltage difference between the first output signal out1_p and the second output signal out1_n to output a first internal signal out2_p and a second internal signal out2_n.

In view of the above, in the receiving circuit provided by the embodiments of the present disclosure, the input buffer 101 that may be operated in both the differential mode and the single-ended mode is designed. On the one hand, it is beneficial to reduce the complexity of the receiving circuit and reduce the layout area of the receiving circuit; and on the other hand, the input buffer 101 receives the first input signal input1 and the second input signal input2 through the same transmission path in the differential mode and the single-ended mode, thereby reducing the interference suffered by the first input signal input1 and the second input signal input2 when the receiving circuit is switched between the differential mode and the single-ended mode, and improving the accuracy of the first internal signal out2_p and the second internal signal out2_n outputted by the conversion module 102; additionally, the complexity of the receiving circuit is simplified, and using only one input buffer 101 facilitates receiving the operating current of the receiving circuit, thereby facilitating reducing the overall power consumption of the receiving circuit.

In some embodiments, the first signal In1 and the second signal In2 may be a clock signal and a complementary clock signal, respectively. When the receiving circuit is operated in the differential mode, the receiving circuit is usually configured to receive a signal having a higher frequency to obtain better performance. When the receiving circuit is operated in the single-ended mode, the receiving circuit only receives one clock signal having a lower frequency, and receives the reference voltage signal vref for a lower-frequency operation to save the power consumption.

Figure 5:
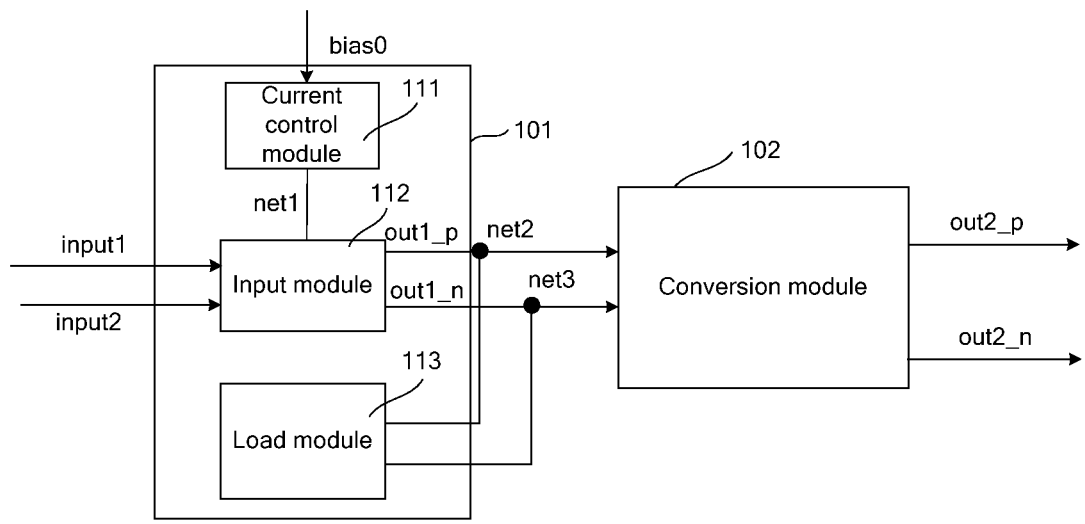

In some embodiments, referring to FIG. 5, the input buffer 101 may include: a current control module 111 configured to provide a current to a first node net1 in response to a bias voltage signal bias0; an input module 112 connected to the first node net1; and a load module 113 connected to the input module 112, the input module 112 being connected to the load module 113 via a second node net2 and a third node net3; where, the input module 112 receives the first input signal input1 and the second input signal input2, the second node net2 outputs the first output signal out1_p (referring to FIG. 1), and the third node net3 outputs the second output signal out1_n (referring to FIG. 1).

In some embodiments, still referring to FIG. 5, the current control module 111 may be configured to adjust, in response to the bias voltage signal bias0, the current provided to the first node net1, such that the current provided to the first node net1 in the single-ended mode is less than the current provided to the first node net1 in the differential mode. In this way, it is beneficial to reduce the operating current in the receiving circuit in the single-ended mode, thereby reducing the overall power consumption of the receiving circuit.

In one example, referring to FIG. 7, the current control module 111 may include: a first P-channel metal oxide semiconductor (PMOS) transistor MP1 provided with a gate for receiving an enable signal EnN and a source connected to a power voltage Vccl; and a second PMOS transistor MP2 and a third PMOS transistor MP3, where a source of the second PMOS transistor MP2 and a source of the third PMOS transistor MP3 are both connected to a drain of the first PMOS transistor MP1, a drain of the second PMOS transistor MP2 and a drain of the third PMOS transistor MP3 are both connected to the first node net1, and a gate of the second PMOS transistor MP2 and a gate of the third PMOS transistor MP3 both receive the bias voltage signal bias0. In this way, the control enable signal EnN may be used as a general switch for whether the input buffer 101 is operated. For example, when the control enable signal EnN is at a low level, the first PMOS transistor MP1 is turned on, such that the input buffer 101 may be operated. When the control enable signal EnN is at a high level, the first PMOS transistor MP1 is turned off, and at this time, regardless of whether the bias voltage signal bias0 is at a high level or a low level, there is no current path in the input buffer 101. That is, the input buffer 101 is not operated.

In addition, the turn-on degree of the second PMOS transistor MP2 and the turn-on degree of the third PMOS transistor MP3 are adjusted by controlling the level of the bias voltage signal bias0, such that the current provided by the current control module 111 to the first node net1 in the single-ended mode is less than the current provided to the first node net1 in the differential mode. For example, in the differential mode, the bias voltage signal bias0 is controlled to be at a first level; and in the single-ended mode, the bias voltage signal bias0 is controlled to be at a second level, and the second level is greater than the first level. In this way, the turn-on degree of the second PMOS transistor MP2 and the turn-on degree of the third PMOS transistor MP3 in the differential mode are greater than those in the single-ended mode, such that the current at the first node net1 in the differential mode is greater than the current at the first node net1 in the single-ended mode.

In some embodiments, referring to FIG. 8, the current control module 111 may include: a first control unit 1111 connected to the first node net1 and configured to be on in response to the bias voltage signal bias0 to provide a first current to the first node net1; and a second control unit 1112 connected to the first node net1 and configured to be on in response to a control signal SeEn and the bias voltage signal bias0 to provide a second current to the first node net1; where, in the single-ended mode, the first control unit 1111 is turned on but the second control unit 1112 is not turned on, and in the differential mode, the first control unit 1111 and the second control unit 1112 are both turned on. In view of the above, in the single-ended mode, there is only one current path of the first control unit 1111 that is turned on to provide the current to the first node net1. That is, the current at the first node net1 is the first current. In the differential mode, there are two parallel current paths of the first control unit 1111 and the second control unit 1112 that are turned on to provide the current to the first node net1. That is, the current at the first node net1 is the sum of the first current and the second current, such that the current at the first node net1 in the single-ended mode is less than the current at the first node net1 in the differential mode.

In some embodiments, still referring to FIG. 8, the first control unit 1111 may include: a first PMOS transistor MP1 provided with a gate for receiving an enable signal EnN and a source connected to a power voltage Vccl; and a second PMOS transistor MP2 and a third PMOS transistor MP3, where a source of the second PMOS transistor MP2 and a source of the third PMOS transistor MP3 are both connected to a drain of the first PMOS transistor MP1, a drain of the second PMOS transistor MP2 and a drain of the third PMOS transistor MP3 are both connected to the first node net1, and a gate of the second PMOS transistor MP2 and a gate of the third PMOS transistor MP3 both receive the bias voltage signal bias0. The control enable signal EnN may be used as a general switch for whether the first control unit 1111 is operated. For example, when the control enable signal EnN is at a low level, the first PMOS transistor MP1 is turned on, such that the first control unit 1111 may be operated. When the control enable signal EnN is at a high level, the first PMOS transistor MP1 is turned off, and at this time, regardless of whether the bias voltage signal bias0 is at a high level or a low level, there is no current path in the first control unit 1111. That is, the first control unit 1111 is not operated.

Still referring to FIG. 8, the second control unit 1112 may include: a fourth PMOS transistor MP4 provided with a gate for receiving a control signal SeEn and a source connected to the power voltage Vccl; and a fifth PMOS transistor MP5 and a sixth PMOS transistor MP6, where a source of the fifth PMOS transistor MP5 and a source of the sixth PMOS transistor MP6 are both connected to a drain of the fourth PMOS transistor MP4, a drain of the fifth PMOS transistor MP5 and a drain of the sixth PMOS transistor MP6 are both connected to the first node net1, and a gate of the fifth PMOS transistor MP5 and a gate of the sixth PMOS transistor MP6 both receive the bias voltage signal bias0.

In one example, in the single-ended mode, when the enable signal EnN is at a low level, the first PMOS transistor MP1 is turned on, the bias voltage signal bias0 is at a level that may cause the second PMOS transistor MP2 and the third PMOS transistor MP3 to be turned on, and the turn-on degree of the second PMOS transistor MP2 and the turn-on degree of the third PMOS transistor MP3 may be controlled by adjusting the magnitude of the level of the bias voltage signal bias0, to control the magnitude of the current flowing through the second PMOS transistor MP2 and the magnitude of the current flowing through the third PMOS transistor MP3. When the control signal SeEn is at a high level, the fourth PMOS transistor MP4 is at an off state, and regardless of the level of the bias voltage signal bias0, no current flows through the fifth PMOS transistor MP5 and the sixth PMOS transistor MP6. That is, the second control unit 1112 is not turned on, and the current at the first node net1 is provided only by the first control unit 1111. In the differential mode, when the enable signal EnN is at a low level, the first PMOS transistor MP1 is turned on, the bias voltage signal bias0 is at a level that may cause the second PMOS transistor MP2 and the third PMOS transistor MP3 to be turned on, and the turn-on degree of the second PMOS transistor MP2 and the turn-on degree of the third PMOS transistor MP3 may be controlled by adjusting the magnitude of the level of the bias voltage signal bias0, to control the magnitude of the current flowing through the second PMOS transistor MP2 and the magnitude of the current flowing through the third PMOS transistor MP3. Moreover, when the control signal SeEn is at a low level, the fourth PMOS transistor MP4 is turned on, and the bias voltage signal bias0 is also at a level that may cause the fifth PMOS transistor MP5 and the sixth PMOS transistor MP6 to be turned on, and the turn-on degree of the fifth PMOS transistor MP5 and the turn-on degree of the sixth PMOS transistor MP6 may be controlled by adjusting the magnitude of the level of the bias voltage signal bias0, to control the magnitude of the current flowing through the fifth PMOS transistor MP5 and the magnitude of the current flowing through the sixth PMOS transistor MP6. That is, the first control unit 1111 and the second control unit 1112 are both turned on, and the current at the first node net1 is the sum of the first current and the second current.

In some embodiments, referring to FIG. 7 and FIG. 8, the input module 112 may include: a seventh PMOS transistor MP7 provided with a gate for receiving the first input signal input1, a source connected to the first node net1, and a drain connected to the second node net2; and an eighth PMOS transistor MP8 provided with a gate for receiving the second input signal input2, a source connected to the first node net1, and a drain connected to the third node net3.

It should be noted that, the level of the first input signal input1 and the level of the second input signal input2 are changed asynchronously, such that the turn-on moment of the seventh PMOS transistor MP7 for receiving the first input signal input1 is different from the turn-on moment of the eighth PMOS transistor MP8 for receiving the second input signal input; and at the same moment, the turn-on degree of the seventh PMOS transistor MP7 is different from the turn-on degree of the eighth PMOS transistor MP8. It can be understood that, since the turn-on degree of the seventh PMOS transistor MP7 is different from the turn-on degree of the eighth PMOS transistor MP8, and the shunt capability of the seventh PMOS transistor MP7 to the current at the first node net1 is also different from the shunt capability of the eighth PMOS transistor MP8 to the current at the first node net1, the voltage at the second node net2 is different from the voltage at the third node net3.

In one example, when the level of the first input signal input1 is higher than the level of the second input signal input2, the turn-on degree of the eighth PMOS transistor MP8 is greater than the turn-on degree of the seventh PMOS transistor MP7, such that the current at the first node net1 flows more into a path where the eighth PMOS transistor MP8 is located, and the current at the third node net3 is greater than the current at the second node net2. The voltage at the third node net3 is higher than the voltage at the second node net2, such that the level of the second output signal out1_$n$ outputted by the third node net3 is high, and the level of the first output signal out1_$p$ outputted by the second node net2 is low. That is, the first output signal out1_$p$ and the second output signal out1_$n$ are complementary.

In some embodiments, referring to FIG. 7 and FIG. 8, the load module 113 may include: a first load unit 1131 connected between the second node net2 and a ground terminal, and configured such that an equivalent resistance of the first load unit 1131 in the single-ended mode is greater than an equivalent resistance of the first load unit 1131 in the differential mode; and a second load unit 1132 connected between the third node net3 and the ground terminal, and configured such that an equivalent resistance of the second load unit 1132 in the single-ended mode is greater than an equivalent resistance of the second load unit 1132 in the differential mode. In view of the above, regardless of whether it is the first load unit 1131 or the second load unit 1132, the equivalent resistance in the single-ended mode is greater than the equivalent resistance in the differential mode. The current at the first node net1 in the single-ended mode is less than the current at the first node net1 in the differential mode, and the current at the first node net1 is the sum of the current at the second node net2 and the current at the third node net3. Therefore, on the premise that the turn-on degree of the eighth PMOS transistor MP8 is different from the turn-on degree of the seventh PMOS transistor MP7, the absolute value of the current difference between the current at the second node net2 and the current at the third node net3 in the single-ended mode is a first difference, and the absolute value of the current difference between the current at the second node net2 and the current at the third node net3 in the differential mode is a second difference. That is, the first difference is less than the second difference.

In this way, regardless of whether it is the first load unit 1131 or the second load unit 1132, when the equivalent resistance in the single-ended mode is greater than the equivalent resistance in the differential mode, in the case that a greater equivalent resistance may make the difference between the current at the second node net2 and the current at the third node net3 in the single-ended mode less, the difference between the voltage at the second node net2 and the voltage at the third node net3 may be greater. That is, in the single-ended mode, there is still a greater voltage swing at the second node net2 and the third node net3.

It can be understood that, the product of the equivalent resistance of the first load unit 1131 and the current flowing through the second node net2 is a first product, the product of the equivalent resistance of the second load unit 1132 and the current flowing through the third node net3 is a second product, and the difference between the voltage at the second node net2 and the voltage at the third node net3 is a difference between the first product and the second product. In one example, the equivalent resistance of the first load unit 1131 is equal to the equivalent resistance of the second load unit 1132, and then the difference between the voltage at the second node net2 and the voltage at the third node net3 is a product of the equivalent resistance and the difference between the current flowing through the second node net2 and the current at the third node net3.

In some embodiments, referring to FIG. 9, the first load unit 1131 may include a first sub-resistor R1 and a second sub-resistor R2 connected in series, and a third sub-resistor R3 and a fourth sub-resistor R4 connected in parallel, where the first sub-resistor R1 is provided with one end connected to the second node net2 and the other end connected to one end of the second sub-resistor R2, the other end of the second sub-resistor R2 is connected to one end of the third sub-resistor R3 and one end of the fourth sub-resistor R4 at the same time, and the other end of the third sub-resistor R3 is connected to the other end of the fourth sub-resistor R4. The second load unit 1132 may include a fifth sub-resistor R5 and a sixth sub-resistor R6 connected in series, and a seventh sub-resistor R7 and an eighth sub-resistor R8 connected in parallel, where the fifth sub-resistor R5 is provided with one end connected to the third node net3 and the other end connected to one end of the sixth sub-resistor R6, the other end of the sixth sub-resistor R6 is connected to one end of the seventh sub-resistor R7 and one end of the eighth sub-resistor R8 at the same time, and the other end of the seventh sub-resistor R7 is connected to the other end of the eighth sub-resistor R8.

It should be noted that, no matter for the first load unit 1131 or the second load unit 1132, there is an example in FIG. 9 where there are only two sub-resistors connected in series and two sub-resistors connected in parallel. In practical applications, according to actual requirements for the equivalent resistance of the first load unit 1131 and/or the equivalent resistance of the second load unit 1132 in the receiving circuit, the number of sub-resistors connected in series and the number of sub-resistors connected in parallel may be reasonably designed; or, only several sub-resistors connected in series are designed to constitute the first load unit 1131 and/or the second load unit 1132; or, only several sub-resistors connected in parallel are designed to constitute the first load unit 1131 and/or the second load unit 1132; or, several sub-resistor groups that already form a parallel circuit are designed to constitute the first load unit 1131 and/or the second load unit 1132.

In some embodiments, referring to FIG. 10 and FIG. 11, the first load unit 1131 may include: a first resistor 1133 connected between the second node net2 and a fourth node net4; and a first adjustable load 1134 connected between the fourth node net4 and the ground terminal, configured to adjust an equivalent resistance of the first adjustable load 1134 in response to an adjustment signal SeEnN, and configured such that an equivalent resistance of the first adjustable load 1134 in the single-ended mode is greater than an equivalent resistance of the first adjustable load 1134 in the differential mode; and the second load unit 1132 may include: a second resistor 1135 connected between the third node net3 and a fifth node net5; and a second adjustable load 1136 connected between the fifth node net5 and the ground terminal, configured to adjust an equivalent resistance of the second adjustable load 1136 in response to the adjustment signal SeEnN, and configured such that an equivalent resistance of the second adjustable load 1136 in the single-ended mode is greater than an equivalent resistance of the second adjustable load 1136 in the differential mode. In this way, the equivalent resistance of the first adjustable load 1134 in the single-ended mode is controlled to be greater than the equivalent resistance of the first adjustable load 1134 in the differential mode, which is beneficial to ensure that the equivalent resistance of the first load unit 1131 in the single-ended mode is greater than the equivalent resistance of the first load unit 1131 in the differential mode. The equivalent resistance of the second adjustable load 1136 in the single-ended mode is controlled to be greater than the equivalent resistance of the second adjustable load 1136 in the differential mode, which is beneficial to ensure that the equivalent resistance of the second load unit 1132 in the single-ended mode is greater than the equivalent resistance of the second load unit 1132 in the differential mode.

It should be noted that, in some embodiments, a resistance of the first resistor 1133 and a resistance of the second resistor 1135 are 0. That is, the load module 113 has only an adjustable load part, the second node net2 and the fourth node net4 are nodes having the same potential, and the third node net3 and the fifth node net5 are nodes having the same potential.

In some embodiments, referring to FIG. 11, the first adjustable load 1134 may include: a third resistor 1137 connected between the fourth node net4 and the ground terminal; and a first metal oxide semiconductor (MOS) transistor M1 provided with a first terminal connected to the fourth node net4, a second terminal connected to the ground terminal, and a control terminal for receiving the adjustment signal SeEnN, where, the first MOS transistor M1 is turned off in response to the adjustment signal SeEnN in the single-ended mode, and the first MOS transistor M1 is turned on in response to the adjustment signal SeEnN in the differential mode.

It can be understood that, the third resistor 1137 is in a parallel relationship with the first MOS transistor M1. In the single-ended mode, when the first MOS transistor M1 is turned off in response to the adjustment signal SeEnN, the first adjustable load 1134 includes the third resistor 1137. In the differential mode, when the first MOS transistor M1 is turned on in response to the adjustment signal SeEnN, the first adjustable load 1134 includes the third resistor 1137 and the first MOS transistor M1 connected in parallel. The resistance of the third resistor 1137 is greater than the total resistance of the third resistor 1137 and the first MOS transistor M1 connected in parallel, such that the equivalent resistance of the first adjustable load 1134 in the single-ended mode is greater than the equivalent resistance of the first adjustable load 1134 in the differential mode.

It should be noted that, there is an example in FIG. 11 where the third resistor 1137 includes a ninth sub-resistor R9, a tenth sub-resistor R10, an eleventh sub-resistor R11, and a twelfth sub-resistor R12 sequentially connected in series. In practical applications, according to actual requirements for the resistance of the third resistor 1137 in the receiving circuit, the number of sub-resistors connected in series is reasonably designed; or, several sub-resistors connected in parallel are designed to constitute the third resistor 1137; or, several sub-resistor groups that already form a parallel circuit are designed to constitute the third resistor 1137; or, the third resistor 1137 having sub-resistors connected in series and sub-resistors connected in parallel is designed. In addition, there is an example in FIG. 11 where the first MOS transistor M1 is an N-channel metal oxide semiconductor (NMOS) transistor. In the single-ended mode, the adjustment signal SeEnN is at a low level, and the first MOS transistor M1 is in an off state. In the differential mode, the adjustment signal SeEnN is at a high level, and the first MOS transistor M1 is turned on. In practical applications, the first MOS transistor M1 may also be a PMOS transistor. In the single-ended mode, the adjustment signal SeEnN is at a high level, and the first MOS transistor M1 is in an off state. In the differential mode, the adjustment signal SeEnN is at a low level, and the first MOS transistor M1 is turned on.

Still referring to FIG. 11, the second adjustable load 1136 may include: a fourth resistor 1138 connected between the fifth node net5 and the ground terminal; and a second MOS transistor M2 provided with a first terminal connected to the fifth node net5, a second terminal connected to the ground terminal, and a control terminal for receiving the adjustment signal SeEnN, where, the second MOS transistor M2 is turned off in response to the adjustment signal SeEnN in the single-ended mode, and the second MOS transistor M2 is turned on in response to the adjustment signal SeEnN in the differential mode.

It can be understood that, the fourth resistor 1138 is in a parallel relationship with the second MOS transistor M2. In the single-ended mode, when the second MOS transistor M2 is turned off in response to the adjustment signal SeEnN, the second adjustable load 1136 includes the fourth resistor 1138. In the differential mode, when the second MOS transistor M2 is turned on in response to the adjustment signal SeEnN, the second adjustable load 1136 includes the fourth resistor 1138 and the second MOS transistor M2 connected in parallel. The resistance of the fourth resistor 1138 is greater than the total resistance of the fourth resistor 1138 and the second MOS transistor M2 connected in parallel, such that the equivalent resistance of the second adjustable load 1136 in the single-ended mode is greater than the equivalent resistance of the second adjustable load 1136 in the differential mode.

It should be noted that, there is an example in FIG. 11 where the fourth resistor 1138 includes a thirteenth sub-resistor R13, a fourteenth sub-resistor R14, a fifteenth sub-resistor R15, and a sixteenth sub-resistor R16 sequentially connected in series. In practical applications, according to actual requirements for the resistance of the fourth resistor 1138 in the receiving circuit, the number of sub-resistors connected in series is reasonably designed; or, several sub-resistors connected in parallel are designed to constitute the fourth resistor 1138; or, several sub-resistor groups that already form a parallel circuit are designed to constitute the fourth resistor 1138; or, the fourth resistor 1138 having sub-resistors connected in series and sub-resistors connected in parallel is designed. In addition, there is an example in FIG. 11 where the second MOS transistor M2 is an NMOS transistor. In the single-ended mode, the adjustment signal SeEnN is at a low level, and the second MOS transistor M2 is in an off state. In the differential mode, the adjustment signal SeEnN is at a high level, and the second MOS transistor M2 is turned on. In practical applications, the second MOS transistor M2 may also be a PMOS transistor. In the single-ended mode, the adjustment signal SeEnN is at a high level, and the second MOS transistor M2 is in an off state. In the differential mode, the adjustment signal SeEnN is at a low level, and the second MOS transistor M2 is turned on.

Still referring to FIG. 11, in some embodiments, the first resistor 1133 may include a first sub-resistor R1 and a second sub-resistor R2 connected in series, and a third sub-resistor R3 and a fourth sub-resistor R4 connected in parallel, where the first sub-resistor R1 is provided with one end connected to the second node net2 and the other end connected to one end of the second sub-resistor R2, the other end of the second sub-resistor R2 is connected to one end of the third sub-resistor R3 and one end of the fourth sub-resistor R4 at the same time, and the other end of the third sub-resistor R3 is connected to the other end of the fourth sub-resistor R4.

The second resistor 1135 may include a fifth sub-resistor R5 and a sixth sub-resistor R6 connected in series, and a seventh sub-resistor R7 and an eighth sub-resistor R8 connected in parallel, where the fifth sub-resistor R5 is provided with one end connected to the third node net3 and the other end connected to one end of the sixth sub-resistor R6, the other end of the sixth sub-resistor R6 is connected to one end of the seventh sub-resistor R7 and one end of the eighth sub-resistor R8 at the same time, and the other end of the seventh sub-resistor R7 is connected to the other end of the eighth sub-resistor R8.

In some embodiments, referring to FIG. 3, the receiving circuit may further include: a selection module 103 receiving an original first signal In1, an original second signal In2, and an original reference voltage signal vref, and configured to provide the first input signal input1 and the second input signal input2 to the input buffer 101 in response to a mode selection signal mode select, where the mode selection signal mode select is configured to represent the single-ended mode or the differential mode, the first signal In1 corresponds to the original first signal In1, the second signal In2 corresponds to the original second signal In2, and the original reference voltage signal vref corresponds to the reference voltage signal vref.

In this way, the receiving circuit may be operated in the differential mode, because the selection module 103 controls the signals received by the receiving circuit are the original first signal In1 and the original second signal In2, such that the signals received by the input buffer 101 are the first signal In1 and the second signal In2; or, the receiving circuit is operated in the single-ended mode, because the selection module 103 controls the signals received by the receiving circuit are one of the original first signal In1 and the original second signal In2, and the original reference voltage signal vref, such that the signals received by the input buffer 101 are one of the first signal In1 and the second signal In2, and the reference voltage signal vref.

In some embodiments, the mode selection signal mode select may include: a second mode selection signal (not shown in the drawings) for representing the single-ended mode; and a first mode selection signal (not shown in the drawings) for representing the differential mode. For example, when the mode selection signal mode select received by the selection module 103 is the first mode selection signal, the selection module 103 controls the signals received by the receiving circuit to be the original first signal In1 and the original second signal In2, such that the signals received by the input buffer 101 are the first signal In1 and the second signal In2. When the mode selection signal mode select received by the selection module 103 is the second mode selection signal, the selection module 103 controls the signals received by the receiving circuit to be one of the original first signal In1 and the original second signal In2, and the original reference voltage signal vref, such that the signals received by the input buffer 101 are one of the first signal In1 and the second signal In2, and the reference voltage signal vref.

In some other embodiments, the selection module 103 may also control the receiving circuit to operate in the differential mode or the single-ended mode on the basis of two states of the mode selection signal mode select. For example, when the mode selection signal mode select received by the selection module 103 is at a high level, the signals received by the selection module 103 are controlled to be the original first signal In1 and the original second signal In2, such that the signals received by the input buffer 101 are the first signal In1 and the second signal In2. When the mode selection signal mode select received by the selection module 103 is at a low level, the signals received by the selection module 103 are controlled to be one of the original first signal In1 and the original second signal In2, and the original reference voltage signal vref, such that the signals received by the input buffer 101 are one of the first signal In1 and the second signal In2, and the reference voltage signal vref.

Figure 4:
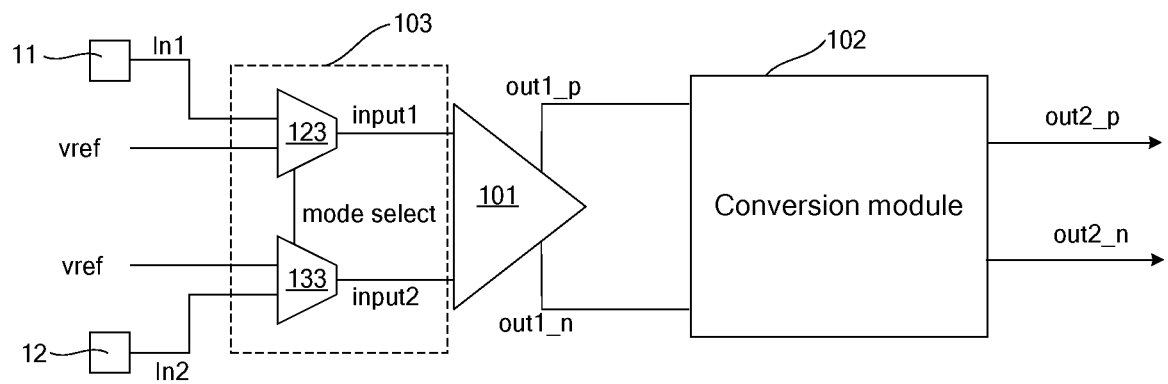

In some embodiments, referring to FIG. 4, the selection module 103 may include: a first selection unit 123 and a second selection unit 133, one of the first selection unit 123 and the second selection unit 133 receiving the original first signal In1 and the original reference voltage signal vref, and the other of the first selection unit 123 and the second selection unit 133 receiving the original second signal In2 and the original reference voltage signal vref; where, in the single-ended mode, one of the first selection unit 123 and the second selection unit 133 outputs the first signal In1 or the second signal In2 in response to the mode selection signal mode select, and the other of the first selection unit 123 and the second selection unit 133 outputs the reference voltage signal vref in response to the mode selection signal mode select; and in the differential mode, one of the first selection unit 123 and the second selection unit 133 outputs the first signal In1 in response to the mode selection signal mode select, and the other of the first selection unit 123 and the second selection unit 133 outputs the second signal In2 in response to the mode selection signal mode select.

In one example, still referring to FIG. 4, the first selection unit 123 receives the original first signal In1 and the original reference voltage signal vref, and the second selection unit 133 receives the original second signal In2 and the original reference voltage signal vref.

In the single-ended mode, the first selection unit 123 outputs the first signal In1 in response to the mode selection signal mode select, and the second selection unit 133 outputs the reference voltage signal vref in response to the mode selection signal mode select. Or, the first selection unit 123 outputs the reference voltage signal vref in response to the mode selection signal mode select, and the second selection unit 133 outputs the second signal In2 in response to the mode selection signal mode select, such that the signals received by the input buffer 101 are one of the first signal In1 and the second signal In2, and the reference voltage signal vref.

In the differential mode, the first selection unit 123 outputs the first signal In1 in response to the mode selection signal mode select, and the second selection unit 133 outputs the second signal In2 in response to the mode selection signal mode select, such that the signals received by the input buffer 101 are the first signal In1 and the second signal In2.

Figure 6:
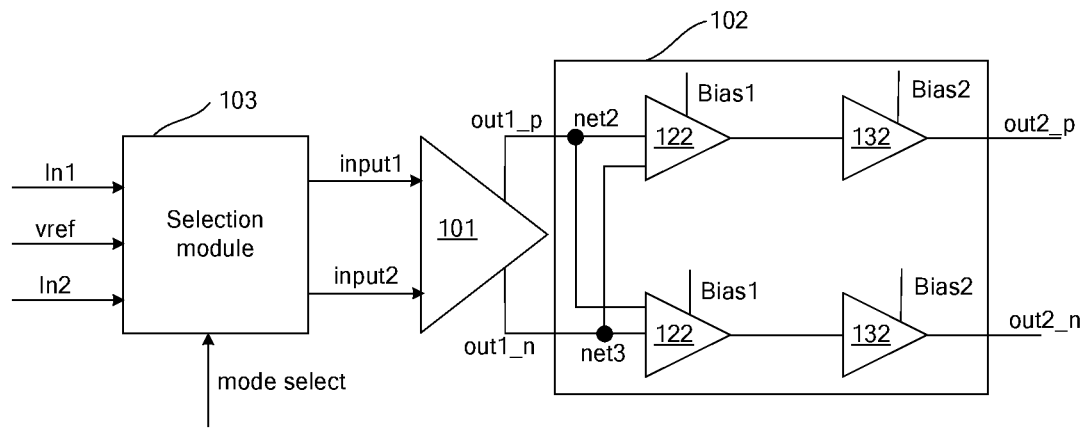

In some embodiments, referring to FIG. 6, the conversion module 102 may include: an amplification unit 122 configured to amplify the voltage difference between the first output signal out1_p and the second output signal out1_n; and a conversion unit 132 configured to perform level logic conversion on the first output signal and the second output signal amplified by the amplification unit 122, and output the first internal signal out2_p and the second internal signal out2_n.

It should be noted that, performing level logic conversion on the first output signal and the second output signal amplified by the amplification unit 122 means that, the first output signal out1_p outputted by the second node net2 and the second output signal out1_n outputted by the third node net3 are converted from an analog level to a digital level. That is, the high-level state of the first internal signal out2_p and/or the high-level state of the second internal signal out2_n outputted by the conversion module 102 are infinitely close to the power voltage, and the low-level state of the first internal signal out2_p and/or the low-level state of the second internal signal out2_n are infinitely close to the ground voltage, thereby facilitating subsequent processing of a logic circuit.

In some embodiments, still referring to FIG. 6, the amplification unit 122 may also be configured to adjust a first operating current of the amplification unit 122 in response to a first bias signal Bias1, such that the first operating current in the single-ended mode is less than the first operating current in the differential mode. In this way, it is beneficial to further ensure that the operating current of the receiving circuit in the single-ended mode is less than the operating current in the differential mode, thereby facilitating reducing the overall power consumption of the receiving circuit.

In some embodiments, still referring to FIG. 6, the conversion unit 132 may also be configured to adjust a second operating current of the conversion unit 132 in response to a second bias signal Bias2, such that the second operating current in the single-ended mode is less than the second operating current in the differential mode. In this way, it is beneficial to further ensure that the operating current of the receiving circuit in the single-ended mode is less than the operating current in the differential mode, thereby facilitating reducing the overall power consumption of the receiving circuit.

It should be noted that, the first bias signal Bias1 and the second bias signal Bias2 may be the same bias signal, thereby facilitating reducing the complexity of the receiving circuit.

The working principle of the receiving circuit provided by one embodiment of the present disclosure is described by taking the receiving circuit shown in FIG. 8 as an example. It should be noted that, the working principle of the first control unit 1111, the second control unit 1112, the input module 112, and the load module 113 is briefly described above. The overall working principle of the receiving circuit is briefly described below with reference to FIG. 8.

Referring to FIG. 8, in the single-ended mode, when the enable signal EnN is at a low level, the first PMOS transistor MP1 is turned on, the bias voltage signal bias0 is at a level that causes the second PMOS transistor MP2 and the third PMOS transistor MP3 to be turned on, and the turn-on degree of the second PMOS transistor MP2 and the turn-on degree of the third PMOS transistor MP3 may be controlled by adjusting the magnitude of the level of the bias voltage signal bias0. When the control signal SeEn is at a high level, the fourth PMOS transistor MP4 is at an off state, and no current flows through the fifth PMOS transistor MP5 and the sixth PMOS transistor MP6. That is, the second control unit 1112 is not turned on.

In the differential mode, when the enable signal EnN is at a low level, the first PMOS transistor MP1 is turned on, the bias voltage signal bias0 is at a level that causes the second PMOS transistor MP2 and the third PMOS transistor MP3 to be turned on. Moreover, when the control signal SeEn is also at a low level, the fourth PMOS transistor MP4 is turned on, the bias voltage signal bias0 is at a level that causes the fifth PMOS transistor MP5 and the sixth PMOS transistor MP6 to be turned on, and the turn-on degree of the fifth PMOS transistor MP5 and the turn-on degree of the sixth PMOS transistor MP6 may be controlled by adjusting the magnitude of the level of the bias voltage signal bias0.

In the above two modes, when the level of the first input signal input1 is higher than the level of the second input signal input2, the level of the second output signal out1_n outputted by the third node net3 is high, and the level of the first output signal out1_p outputted by the second node net2 is low. When the level of the first input signal input1 is lower than the level of the second input signal input2, the level of the second output signal out1_n outputted by the third node net3 is low, and the level of the first output signal out1_p outputted by the second node net2 is high. Moreover, the equivalent resistance of the load module 113 in the single-ended mode is greater than the equivalent resistance of the load module 113 in the differential mode, such that when the difference between the current at the second node net2 and the current at the third node net3 in the single-ended mode is less, the difference between the voltage at the second node net2 and the voltage at the third node net3 may be greater. That is, there is still a greater voltage swing at the second node net2 and the third node net3 in the single-ended mode.

In conclusion, the input buffer 101 that may be operated in both the differential mode and the single-ended mode is designed. On the one hand, it is beneficial to reduce the complexity of the receiving circuit and reduce the layout area of the receiving circuit; and on the other hand, the input buffer 101 receives the first input signal input1 and the second input signal input2 through the same transmission path in the differential mode and the single-ended mode, thereby reducing the interference suffered by the first input signal input1 and the second input signal input2 when the receiving circuit is switched between the differential mode and the single-ended mode, and improving the accuracy of the first internal signal out2_p and the second internal signal out2_n outputted by the conversion module 102; additionally, it is beneficial to make the operating current of the receiving circuit in the single-ended mode less than the operating current of the receiving circuit in the differential mode, thereby reducing the power consumption of the receiving circuit in the single-ended mode.

Another embodiment of the present disclosure also provides a memory, including the receiving circuit described above. In this way, the memory may selectively receive the first signal In1, the second signal In2, and the reference voltage signal vref to selectively operate in the differential mode or the single-ended mode. In the differential mode, the first signal In1 and the second signal In2 received by the memory may be two complementary clock signals, and the first signal In1 and the second signal In2 have a higher frequency, thereby facilitating improving the processing speed and operating performance of the memory. In the single-ended mode, the memory only receives one of the first signal In1 and the second signal In2, i.e., only receiving one clock signal to operate at a lower frequency, thereby facilitating saving the power consumption. In addition, the first signal In1 and the second signal In2 received by the memory may be shared in the differential mode and the single-ended mode; moreover, the operating current of the memory in the single-ended mode may be reduced by adjusting the enable signal EnN, the bias voltage signal bias0, the control signal SeEn, the load module 113, etc., thereby reducing the overall power consumption of the memory.

In some embodiments, the memory may be a double data rate (DDR) memory, for example, a DDR5 memory.

The embodiments or implementations of this specification are described in a progressive manner, and each embodiment focuses on differences from other embodiments. The same or similar parts between the embodiments may refer to each other.

In the description of this specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In the receiving circuit and the memory provided by the embodiments of the present disclosure, the input buffer may be operated in the differential mode through the first signal and the second signal, and may also be operated in the single-ended mode through the reference voltage signal and one of the first signal and the second signal. That is, the same input buffer may be operated in the differential mode, and may also be operated in the single-ended mode, thereby facilitating reducing the complexity of the receiving circuit, and reducing the layout area of the receiving circuit. In addition, in the single-ended mode, the input buffer only receives one of the first signal and the second signal, and the additionally received signal is the reference voltage signal, which may reduce the operating current in the receiving circuit, thereby facilitating reducing the power consumption of the receiving circuit.

The invention claimed is:

1. A receiving circuit, comprising:
an input buffer, configured to receive a first input signal and a second input signal, compare the first input signal with the second input signal, and output a first output signal and a second output signal, wherein in a differential mode, the first input signal and the second input signal are respectively a first signal and a second signal, and in a single-ended mode, the first input signal is one of the first signal and the second signal, the second input signal is a reference voltage signal, and the first signal and the second signal are complementary;
a conversion module, configured to receive the first output signal and the second output signal and amplify a voltage difference between the first output signal and the second output signal to output a first internal signal and a second internal signal; and
a selection module, receiving an original first signal, an original second signal, and an original reference voltage signal, the selection module being configured to provide the first input signal and the second input signal to the input buffer in response to a mode selection signal, wherein the mode selection signal is configured to represent the single-ended mode or the differential mode, the first signal corresponds to the original first signal, the second signal corresponds to the original second signal, and the original reference voltage signal corresponds to the reference voltage signal.

2. The receiving circuit according to claim 1, wherein the selection module comprises:
a first selection unit and a second selection unit, one of the first selection unit and the second selection unit receiving the original first signal and the original reference voltage signal, and the other of the first selection unit and the second selection unit receiving the original second signal and the original reference voltage signal; wherein,
in the single-ended mode, one of the first selection unit and the second selection unit outputs the first signal or the second signal in response to the mode selection signal, and the other of the first selection unit and the second selection unit outputs the reference voltage signal in response to the mode selection signal; and in the differential mode, one of the first selection unit and the second selection unit outputs the first signal in response to the mode selection signal, and the other of the first selection unit and the second selection unit outputs the second signal in response to the mode selection signal.

3. The receiving circuit according to claim 1, wherein the input buffer comprises:

a current control module, configured to provide a current to a first node in response to a bias voltage signal; and an input module, connected to the first node; and a load module, connected to the input module, the input module being connected to the load module via a second node and a third node;

wherein, the input module receives the first input signal and the second input signal, the second node outputs the first output signal, and the third node outputs the second output signal.

4. The receiving circuit according to claim 3, wherein the current control module is configured to adjust, in response to the bias voltage signal, the current provided to the first node, such that the current provided to the first node in the single-ended mode is less than the current provided to the first node in the differential mode.

5. The receiving circuit according to claim 3, wherein the current control module comprises:

a first control unit, connected to the first node and configured to be on in response to the bias voltage signal to provide a first current to the first node; and a second control unit, connected to the first node and configured to be on in response to a control signal and the bias voltage signal to provide a second current to the first node;

wherein, in the single-ended mode, the first control unit is turned on but the second control unit is not turned on, and in the differential mode, the first control unit and the second control unit are both turned on.

6. The receiving circuit according to claim 5, wherein the first control unit comprises:

a first P-channel metal oxide semiconductor (PMOS) transistor, provided with a gate for receiving an enable signal and a source connected to a power voltage; and a second PMOS transistor and a third PMOS transistor, wherein a source of the second PMOS transistor and a source of the third PMOS transistor are both connected to a drain of the first PMOS transistor, a drain of the second PMOS transistor and a drain of the third PMOS transistor are both connected to the first node, and a gate of the second PMOS transistor and a gate of the third PMOS transistor both receive the bias voltage signal.

7. The receiving circuit according to claim 5, wherein the second control unit comprises:

a fourth P-channel metal oxide semiconductor (PMOS) transistor, provided with a gate for receiving the control signal and a source connected to a power voltage; and a fifth PMOS transistor and a sixth PMOS transistor, wherein a source of the fifth PMOS transistor and a source of the sixth PMOS transistor are both connected to a drain of the fourth PMOS transistor, a drain of the fifth PMOS transistor and a drain of the sixth PMOS transistor are both connected to the first node, and a gate of the fifth PMOS transistor and a gate of the sixth PMOS transistor both receive the bias voltage signal.

8. The receiving circuit according to claim 3, wherein the input module comprises:

a seventh P-channel metal oxide semiconductor (PMOS) transistor, provided with a gate for receiving the first input signal, a source connected to the first node, and a drain connected to the second node; and an eighth PMOS transistor, provided with a gate for receiving the second input signal, a source connected to the first node, and a drain connected to the third node.

9. The receiving circuit according to claim 3, wherein the load module comprises:

a first load unit, connected between the second node and a ground terminal, and configured such that an equivalent resistance of the first load unit in the single-ended mode is greater than an equivalent resistance of the first load unit in the differential mode; and a second load unit, connected between the third node and the ground terminal, and configured such that an equivalent resistance of the second load unit in the single-ended mode is greater than an equivalent resistance of the second load unit in the differential mode.

10. The receiving circuit according to claim 9, wherein the first load unit comprises:

a first resistor, connected between the second node and a fourth node; and a first adjustable load, connected between the fourth node and the ground terminal, configured to adjust an equivalent resistance of the first adjustable load in response to an adjustment signal, and configured such that an equivalent resistance of the first adjustable load in the single-ended mode is greater than an equivalent resistance of the first adjustable load in the differential mode; and the second load unit comprises:

a second resistor, connected between the third node and a fifth node; and a second adjustable load, connected between the fifth node and the ground terminal, configured to adjust an equivalent resistance of the second adjustable load in response to the adjustment signal, and configured such that an equivalent resistance of the second adjustable load in the single-ended mode is greater than an equivalent resistance of the second adjustable load in the differential mode.

11. The receiving circuit according to claim 10, wherein the first adjustable load comprises:

a third resistor, connected between the fourth node and the ground terminal; and a first metal oxide semiconductor (MOS) transistor, provided with a first terminal connected to the fourth node, a second terminal connected to the ground terminal, and a control terminal for receiving the adjustment signal, wherein, the first MOS transistor is turned off in response to the adjustment signal in the single-ended mode, and the first MOS transistor is turned on in response to the adjustment signal in the differential mode.

12. The receiving circuit according to claim 10, wherein the second adjustable load comprises:

a fourth resistor, connected between the fifth node and the ground terminal; and a second metal oxide semiconductor (MOS) transistor, provided with a first terminal connected to the fifth node, a second terminal connected to the ground terminal, and a control terminal for receiving the adjustment signal, wherein, the second MOS transistor is turned off in response to the adjustment signal in the single-ended mode, and the second MOS transistor is turned on in response to the adjustment signal in the differential mode.

13. The receiving circuit according to claim 1, wherein the conversion module comprises:
   an amplification unit, configured to amplify the voltage difference between the first output signal and the second output signal; and
   a conversion unit, configured to perform level logic conversion on the first output signal and the second output signal amplified by the amplification unit, and output the first internal signal and the second internal signal.

14. The receiving circuit according to claim 13, wherein the amplification unit is also configured to adjust a first operating current of the amplification unit in response to a first bias signal, such that the first operating current in the single-ended mode is less than the first operating current in the differential mode.

15. The receiving circuit according to claim 13, wherein the conversion unit is also configured to adjust a second operating current of the conversion unit in response to a second bias signal, such that the second operating current in the single-ended mode is less than the second operating current in the differential mode.

16. A memory, comprising the receiving circuit according to claim 1.

17. A receiving circuit, comprising:
   an input buffer, configured to receive a first input signal and a second input signal, compare the first input signal with the second input signal, and output a first output signal and a second output signal, wherein in a differential mode, the first input signal and the second input signal are respectively a first signal and a second signal, and in a single-ended mode, the first input signal is one of the first signal and the second signal, the second input signal is a reference voltage signal, and the first signal and the second signal are complementary; and
   a conversion module, configured to receive the first output signal and the second output signal and amplify a voltage difference between the first output signal and the second output signal to output a first internal signal and a second internal signal; and
   wherein the input buffer comprises:
   a current control module, configured to provide a current to a first node in response to a bias voltage signal; and
   an input module, connected to the first node; and a load module, connected to the input module, the input module being connected to the load module via a second node and a third node;
   wherein, the input module receives the first input signal and the second input signal, the second node outputs the first output signal, and the third node outputs the second output signal.

* * * * *